(12) United States Patent
Mnich et al.

(10) Patent No.: US 6,501,696 B1
(45) Date of Patent: Dec. 31, 2002

(54) CURRENT STEERING REDUCED BITLINE VOLTAGE SWING, SENSE AMPLIFIER

(75) Inventors: Thomas M. Mnich, Woodland Park, CO (US); John Eric Gross, Monument, CO (US)

(73) Assignee: Cypress Seminconductor Corp., San Jose, CA (US)

( * ) Notice: Subject to any disclaimer, the term of this patent is extended or adjusted under 35 U.S.C. 154(b) by 24 days.

(21) Appl. No.: 09/855,411

(22) Filed: May 15, 2001

(51) Int. Cl.[7] .................................................. G11C 7/00
(52) U.S. Cl. ........................ 365/207; 365/190; 365/208
(58) Field of Search ................................. 365/207, 190, 365/189.07, 189.09, 208

(56) References Cited

U.S. PATENT DOCUMENTS

| | | | |
|---|---|---|---|
| 4,771,194 A | * 9/1988 | Van Zeghbroeck | 365/207 |
| 4,954,992 A | * 9/1990 | Kumanoya et al. | 365/207 |
| 5,396,467 A | * 3/1995 | Liu et al. | 365/210 |
| 5,737,260 A | 4/1998 | Takata et al. | 365/145 |
| 6,370,072 B1 | * 2/2002 | Dennard et al. | 365/210 |

* cited by examiner

*Primary Examiner*—Son T. Dinh
(74) *Attorney, Agent, or Firm*—Christopher P. Maiorana, P.C.

(57) ABSTRACT

A method for reading a memory cell comprising the steps of (A) raising a voltage level of a bitline of the memory cell above a predetermined level, (B) detecting a current flow generated on the bitline in response to the raised voltage level, and (C) coupling one or more sense nodes coupled to the bitline to a ground potential when the current flow is above a predetermined magnitude.

20 Claims, 4 Drawing Sheets

CURRENT STEERING REDUCED BITLINE VOLTAGE SWING, SENSE AMPLIFIER

FIELD OF THE INVENTION

The present invention relates to a method and/or architecture for implementing sense amplifiers generally and, more particularly, to a method and/or architecture for implementing a current steering, reduced bitline voltage swing sense amplifier.

BACKGROUND OF THE INVENTION

Referring to FIG. 1, a diagram of a memory cell 10 is shown. The memory cell 10 includes a transistor 12 and a transistor 14. The transistors 12 and 14 are implemented in silicon, oxide, nitride, oxide, silicon (SONOS) technology. Under nominal conditions, the transistor 12 is implemented as an enhancement mode (e.g., positive) threshold voltage transistor and the transistor 14 is implemented as a depletion mode (e.g., negative) threshold voltage transistor. However, under extended operating conditions, the threshold voltage of the enhancement mode device (i.e., the transistor 12) can become slightly negative (e.g., the transistor 12 can operate as a depletion mode device). The transistors 12 and 14 have a drain connected to a bitline (BL) or bitline bar (BLb), a gate connected in common to a wordline (WL), and a source that receives a read reference voltage (VR). The signals BL and BLb are passed through a selection device such that only one of many such bitline BL/bitline bar BLb signal pairs is coupled to a particular sense amplifier at a time.

A conventional read operation of the memory cell 10 includes the steps of: (i) isolating the sense nodes of the sense amplifier from a supply voltage (VPWR) and a ground potential (VGND); (ii) equalizing the sense nodes, (iii) applying a differential voltage of sufficient magnitude (about 100 mV) across the data nodes by addressing the memory cell 10, and (iv) simultaneously and gradually coupling the sense amplifier to the supply voltage VPWR and the ground potential VGND. As the sense amplifier powers up, the differential voltage between the data nodes is increased until the differential voltage is approximately equal to the supply voltage VPWR. The conventional method of implementing and operating the sense amplifier circuitry has the disadvantages of (i) not sensing very small signal currents and (ii) requiring high memory cell voltage swing.

Due to SONOS device behavior, the absolute voltage levels on the bitlines BL and bitline bars BLb must be limited. The conventional technique used in EEPROM, FLASH, DRAM, and SRAM depends upon application of a small data signal to the sense amplifier prior to enabling. The conventional technique can not be used with some implementations of SONOS memory transistors because of bias restrictions (i.e., SONOS implementations where the maximum voltage level at the bitline BL and the bitline bar BLb must be less than the supply voltage VPWR).

It is desirable to have method and/or architecture for a sense amplifier that may sense small signal currents while limiting memory cell voltage swing for any memory cell implementation.

SUMMARY OF THE INVENTION

The present invention concerns a method for reading a memory cell comprising the steps of (A) raising a voltage level of a bitline of the memory cell above a predetermined level, (B) detecting a current flow generated on the bitline in response to the raised voltage level, and (C) coupling one or more sense nodes coupled to the bitline to a ground potential when the current flow is above a predetermined magnitude.

The objects, features and advantages of the present invention include providing a method and/or architecture for implementing a current steering, reduced bitline voltage swing sense amplifier that may (i) precharge bitlines to a voltage level where the memory cell is non-conductive, (ii) generate a desired voltage signal, (iii) use current steering to generate the desired voltage signal, (iv) use transistors to initiate signal generation by pulsing sense nodes and bitlines to a voltage level where the memory cell conducts current, (v) change the bias point of a sense amplifier, (vi) be used with floating gate non-volatile memory cells (e.g., FLASH, EEPROM, etc.), (vii) be used with a single transistor non-volatile memory cell, (viii) allow sensing of very small signal currents while limiting the voltage swing experienced by the memory cell, (ix) form the memory cell data signal, (x) use cross coupled P-channel transistors in a current steering mode to form the signal voltage, and/or (xi) be used with any memory cell implementation.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

In order to limit a memory cell voltage swing when the memory cell 10 is addressed (coupled to a sense amplifier), a bitline BL/bitline bar BLb precharge level may be equal to a read reference voltage (e.g., VR) of the memory cell. The read reference voltage VR may be a predetermined voltage level in order to meet the design criteria of a particular application. When the precharge level of the memory cell is equal to the read reference voltage VR, there is generally no potential difference between the bitline BL and the bitline bar BLb and no potential across the respective drains and sources of the SONOS memory cell transistors 12 and 14. However, a condition may occur where one of the SONOS transistors 12 and 14 of the memory cell 10 conducts more current than the other transistor at a common bitline BL/bitline bar BLb potential. One of the SONOS transistors 12 and 14 may conduct more current than the other when (i) the two SONOS memory cell transistor 12 and 14 have threshold voltages that are not equal to each other and (ii) the common bitline BL and bitline bar BLb potential is greater than the read reference voltage VR.

Figure 1:
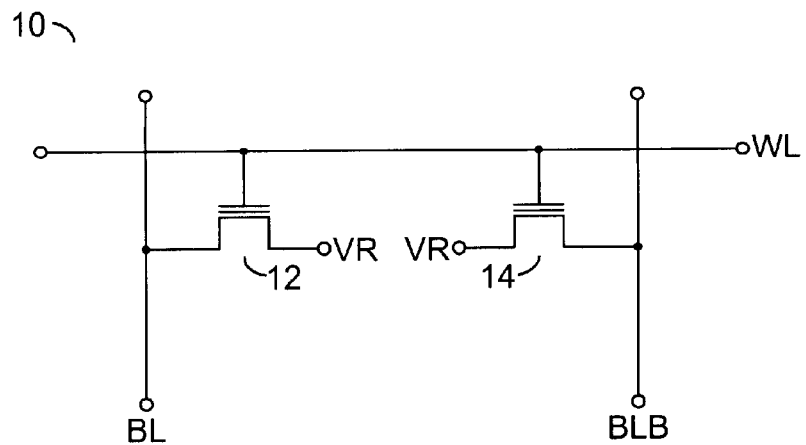
FIG. 1 is a schematic of a SONOS memory cell illustrating a context of the present invention.
Figure 2:
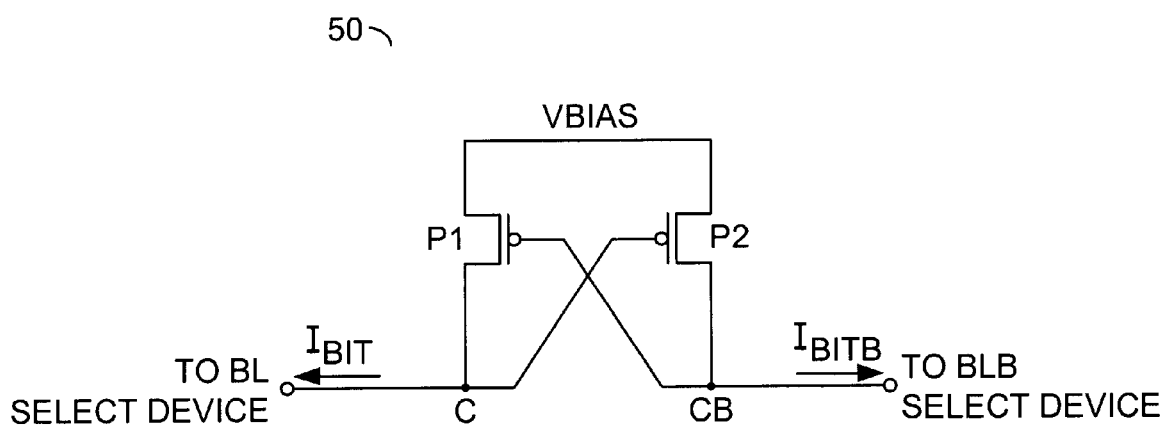
FIG. 2 is a diagram illustrating an operation of a sense amplifier in accordance with a preferred embodiment of the present invention.

Referring to FIG. 2, a diagram of a simplified sense amplifier circuit 50 illustrating an operation of a preferred embodiment of the present invention is shown. The circuit 50 may be implemented in most dynamic random access memories (DRAMs) and in many static random access memories (SRAMs). The circuit 50 may sense the data state stored in a memory cell.

The circuit 50 may comprise, in one implementation, a transistor P1, a transistor P2, a node C, and a node Cb. In one example, the transistors P1 and P2 may be implemented as one or more PMOS transistors. However, other types and/or polarities of transistors may be implemented accordingly to meet the design criteria of a particular application. The transistors P1 and P2 may each have a source that may receive a signal (e.g., VBIAS) The signal VBIAS may be a bias signal. The transistors P1 and P2 may be cross-coupled. The transistor P1 may have a drain that may be connected to a gate of the transistor P2 to form the node C. The node C may be connected to a bitline (e.g., BL) selector device (not shown). The transistor P2 may have a drain that may be connected to a gate of the transistor P1 to form the node Cb. The node Cb may be connected to a bitline bar (e.g., BLb) selector device (not shown). The nodes C and Cb may be coupled to a bitline BL and a bitline bar BLb of a memory device, respectively, via the selector devices. During a read operation of the memory cell 10, a current (e.g., IBIT) may be generated at the node C and a current (e.g., IBITB) may be generated at the node Cb.

The circuit 50 may be configured to sense the state of the memory cell 10 while limiting the maximum bitline voltage swing. The circuit 50 may be configured to slightly raise the bitline/bitline bar potential above the read reference voltage VR and detect which path conducts more current (e.g., which current IBIT or IBITB is larger). The circuit 50 may be implemented using SONOS technology. However, other technologies may be used to meet the design criteria of a particular application.

The signal VBIAS may be manipulated such that nodes C and Cb are nominally biased at the read reference voltage VR. After a memory cell has been selected (addressed), the signal VBIAS may be raised such that the voltage level of the nodes C and Cb rise above the read reference voltage VR. Raising the potential at the nodes C and Cb above the potential VR may generate a current flow in the bitline BL and the bitline bar BLb (e.g., the currents IBIT and IBITB, respectively).

The magnitude of the current IBIT or IBITB will generally be larger in either the bitline BL or bitline bar BLb that corresponds to the transistor of the memory cell in the depletion mode (e.g., erased). The P-channel device of the circuit 50 passing the higher current (e.g., either P1 or P2) may have a correspondingly larger drain-to-source voltage (Vds). The larger Vds in the transistors P1 or P2 generally increases the current flow in the other P-channel device P2 or P1, respectively. The current flows IBIT and IBITB may generate a differential voltage at the nodes C and Cb. The differential voltage generated at the nodes C and Cb generally reflects the data state of the memory cell 10. The lower voltage generally corresponds to the larger of the cell currents IBIT and IBITB. As the read operation progresses, the voltage at one of the nodes C and Cb may approach the bias voltage VBIAS and the voltage of the other node may approach the read reference voltage VR. However, a full logic swing at the end of the sensing operation is generally desirable. To achieve a full voltage swing, circuitry for implementing additional amplification and/or coupling may be connected to the sense amplifier 50.

Figure 3:
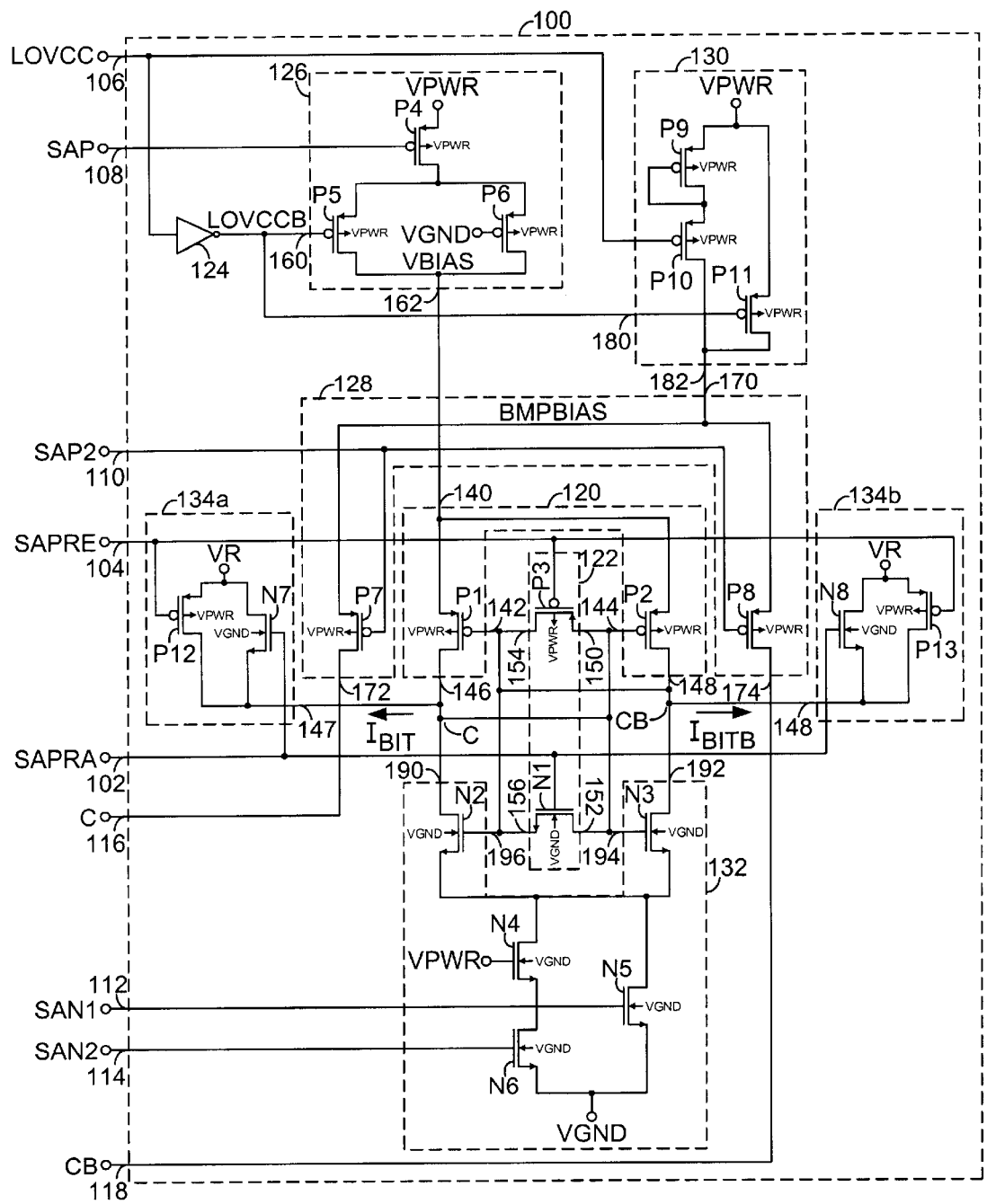
FIG. 3 is a schematic diagram of a preferred embodiment of the present invention.

Referring to FIG. 3, a schematic diagram of a circuit 100 illustrating a sense amplifier in accordance with a preferred embodiment of the present invention is shown. The circuit 100 may be a current steering, reduced bitline voltage swing sense amplifier. The circuit 100 may be configured to sense the state of a silicon, oxide, nitride, oxide, silicon (SONOS) memory cell (e.g., the memory cell 10). However, the circuit 100 may be used with other types of memory cells. The circuit 100 may have an input 102 that may receive a signal (e.g., SAPRE), an input 104 that may receive a signal (e.g., SAPRB), an input 106 that may receive a signal (e.g., LOVCC), an input 108 that may receive a signal (e.g., SAP), an input 110 that may receive a signal (e.g., SAP2), an input 112 that may receive a signal (e.g., SAN1), an input 114 that may receive a signal (e.g., SAN2), a terminal 116 (e.g., the node C) that may be connected to the bitline BL selector device, and a terminal 118 (e.g., the node Cb) that may be connected to the bitline bar BLb selector device. The signals LOVCC and SAP may be bias control signals. The signals SAPRB and SAPRE may be precharge and equalization control signals. The signal SAPRB may be a digital complement of the signal SAPRE. The signals SAN1, SAN2, and SAP2 may be amplifier control signals.

In one example, the circuit 100 may comprise a circuit 120, a circuit 122, a device 124, a circuit 126, a circuit 128, a circuit 130, a circuit 132, and a pair of circuits 134a and 134b. The circuit 120 may be a sense amplifier. The circuit 122 may be an equalization circuit. The device 124 may be an inverting amplifier. In one example, the device 124 may be implemented as a CMOS inverter. The circuits 126 and 130 may be bias generator circuits. The circuit 128 may be an initial signal amplifier. The circuit 132 may be a post-sense amplifier circuit. The circuits 134a and 134b may be precharge circuits.

The circuit 120 may have an input 140 that may receive the signal VBIAS, an input 142 that may be connected to the node Cb, an input 144 that may be connected to the node C, an output 146 that may be connected to the node C, and an output 148 that may be connected to the node Cb. The currents IBIT and IBITB may be presented at the nodes C and Cb, respectively, in response to the state of a memory cell being sensed. In one example, the circuit 120 may be implemented similarly to the circuit 50. The transistors P1 and P2 may each have an N-well that may be connected to a supply voltage (e.g., VPWR).

The circuit 122 may have an input that may receive the signal SAPRB, an input that may receive the signal SAPRE, outputs 150 and 152 that may be connected to the node C, and outputs 154 and 156 that may be connected to the node Cb. The circuit 122 may be configured to equalize a voltage level of the nodes C and Cb. In one example, the circuit 122 may comprise a transistor P3 and a transistor N1. The transistor P3 may have a source that may be connected to the node C, a gate that may receive the signal SAPRB, a drain that may be connected to the node Cb, and an N-well that may receive the supply voltage VPWR. The transistor N1 may have a source that may be connected to the node Cb, a gate that may receive the signal SAPRE, a drain that may be connected to the node C, and a P-well that may receive a ground potential (e.g., VGND). The transistor P3 may be implemented as one or more PMOS transistors. The transistor N1 may be implemented as one or more NMOS transistors. However, other types and/or polarities of transistors may be implemented accordingly to meet the design criteria of a given application.

The device 124 may have an input that may receive the signal LOVCC and an output that may present a signal (e.g., LOVCCB). The signal LOVCCB may be a digital complement of the signal LOVCC. The signal LOVCCB may be a bias control signal. When the signal LOVCC is asserted (e.g., a digital HIGH state or "1"), the supply voltage VPWR may be presented at a value in a low range. In one example, when the signal LOVCC is asserted, the supply voltage VPWR may be in the range of 2.6V–3.7V. When the signal LOVCC is de-asserted (e.g., a digital LOW state or "0"), the supply voltage VPWR may be presented at a higher value. In one example, when the signal LOVCC is de-asserted, the supply voltage VPWR may be greater than 3.7V.

The circuit 126 may have an input that may receive the signal SAP, an input 160 that may receive the signal LOVCCB, and an output 162 that may present the signal VBIAS. In one example, the circuit 126 may comprise a transistor P4, a transistor P5, and a transistor P6. The transistor P4 may have a source that may receive the supply voltage VPWR, a gate that may receive the signal SAP, an N-well that may receive the supply voltage VPWR, and a drain that may be connected to sources of the transistors P5 and P6. The transistor P5 may have a gate that may receive the signal LOVCCB, an N-well that may receive the supply voltage VPWR, and a drain that may be connected to a drain of the transistor P6. The transistor P6 may have a gate that may receive the ground potential VGND and an N-well that may receive the supply voltage VPWR. The signal VBIAS may be presented at a node formed by the connection of the drains of the transistors P5 and P6. The transistors P4, P5, and P6 may be implemented as one or more PMOS transistors. However, other types and/or polarities of transistors may be implemented accordingly to meet the design criteria of a particular application.

The circuit 126 may be configured to generate the bias voltage signal VBIAS in response to the signals SAP and LOVCCB. The transistors P5 and P6 may set different bias conditions in response to the signal LOVCCB. In one example, when the signal LOVCCB is de-asserted (e.g., the signal LOVCC is asserted) the current supplying capability of the circuit 126 may be increased. When the signal LOVCC is asserted, the performance of the circuit 100 may be enhanced when the supply voltage VPWR is in a low range (e.g., when 2.6V<VPWR<3.7V).

The circuit 128 may have an input that may receive the signal SAP2, an input 170 that may receive a signal (e.g., BMPBIAS), an output 172 that may be connected to the node C, and an output 174 that may be connected to the node Cb. The signal BMPBIAS may be a bias signal. The circuit 128 may temporarily elevate a voltage level of the sense nodes C and Cb to a voltage higher than the read reference level VR (e.g., the circuit 128 may pulse the voltage at the nodes C and Cb). However, the circuit 128 generally elevates the voltage on the nodes C and Cb to a level that is lower than the supply voltage VPWR. The voltage level increase of the nodes C and Cb is generally determined by the amount of time that the circuit 128 is active. The amount of time the circuit 128 is enabled may be controlled by the signal SAP2. The circuit 128 may be used during initial sensing to ensure that the circuit 100 remains balanced as the voltages at the nodes C and Cb are raised to initiate signal formation. By raising the voltage on the nodes C and Cb equally, the likelihood of incorrect initial sensing may be reduced.

The circuit 128 may comprise, in one example, a transistor P7 and a transistor P8. The transistor P7 may have a source that may receive the signal BMPBIAS, a gate that may receive the signal SAP2, a drain that may be connected to the node C, and an N-well that may receive the supply voltage VPWR. The transistor P8 may have a source that may receive the signal BMPBIAS, a gate that may receive the signal SAP2, an N-well that may receive the supply voltage VPWR, and a drain that may be connected to the node Cb. The transistors P7 and P8 may be implemented as one or more PMOS transistors. However, other types and/or polarities of transistors may be implemented accordingly to meet the design criteria of a particular application.

The circuit 130 may have an input that may receive the signal LOVCC, an input 180 that may receive the signal LOVCCB, and an output 182 that may present the signal BMPBIAS. The circuit 130 may be configured to generate the bias signal BMPBIAS in response to the signal LOVCC. In one example, the circuit 130 may comprise a transistor P9, a transistor P10, and a transistor P11. The transistor P9 may have a source and an N-well that may receive the supply voltage VPWR, a gate that may be connected to a drain of the transistor P9 (e.g., the transistor P9 may be diode connected), and the drain may be connected to a source of the transistor P10. The transistor P10 may have a gate that may receive the signal LOVCC, an N-well that may receive the supply voltage VPWR, and a drain that may be connected to a drain of the transistor P11. The transistor P11 may have a source and an N-well that may receive the supply voltage VPWR, and a gate that may receive the signal LOVCCB. The signal BMPBIAS may be presented at a node formed by the connection of the drains of the transistors P10 and P11. The transistors P9, P10, and P11 may be implemented as one or more PMOS transistors. However, other types and/or polarities of transistors may be implemented accordingly to meet the design criteria of a particular application.

When the signal LOVCC is asserted and the supply voltage VPWR is in a low range (e.g., 2.6V<VPWR<3.7V), the signal BMPBIAS may be generated by the circuit 130 at a voltage level equal to the supply voltage VPWR. When the signal LOVCC is de-asserted and the supply voltage VPWR is at a higher value (e.g., VPWR>3.7V), the signal BMP-BIAS may be generated by the circuit 130 at a voltage level less than the supply voltage VPWR.

The circuit 132 may have an input that may receive the signal SAN1, an input that may receive the signal SAN2, an input 190 that may be connected to the node C, an input 192 that may be connected to the node Cb, an output 194 that may be connected to the node C, and an output 196 that may be connected to the node Cb. In one example, the circuit 132 may provide amplification of the voltages at the nodes C and Cb in addition to the circuit 128. In another example, (e.g., an implementation of the circuit 100 without the circuits 128 and 130) the circuit 132 may further amplify the voltages at the nodes C and Cb after initial sensing is performed by the circuit 120. In either example, the circuit 132 may also further amplify the currents IBIT and IBITB. The circuit 132 may allow one of the nodes C and Cb, to swing to the ground potential VGND, depending upon the data state sensed on the memory cell 10 during a read operation. The node (C or Cb) that swings to the ground potential VGND generally depends upon the data state sensed (e.g., the node C or Cb corresponding to an erased memory cell generally swings to the ground potential VGND).

In one example, the circuit 132 may comprise a transistor N2, a transistor N3, a transistor N4, a transistor N5, and a transistor N6. The transistor N2 may have a source that may be connected to a source of the transistor N3 and to drains of the transistors N4 and N5. A gate of the transistor N2 may be connected to the node Cb. A drain of the transistor N2 may be connected to the node C. A P-well of the transistor N2 may receive the ground potential VGND. The transistor N3 may have a gate that may be connected to the node C, a drain that may be connected to the node Cb, and a P-well that may receive the ground potential VGND. The transistor N4 may have a source that may be connected to a drain of the transistor N6, a gate that may receive the supply voltage VPWR, and a P-well that may receive the ground potential VGND. The transistor N5 may have a source and a P-well that may receive the ground potential VGND, and a gate that may receive the signal SAN1. The transistor N6 may have a source and a P-well that may receive the ground potential VGND and a gate that may receive the signal SAN2. The transistors N2, N3, N4, N5, and N6 may be implemented as one or more NMOS transistors. However, other types and/or polarities of transistors may be implemented accordingly to meet the design criteria of a particular application.

The circuit 134a may have an input that may receive the signal SAPRE, an input that may receive the signal SAPRB and an output 197 that may be connected to the node C. In one example, the circuit 134a may be a precharge circuit that may be configured to precharge the node C to the read reference level VR in response to the signals SAPRE and SAPRB before a memory read operation using the circuit 100 is performed.

In one example, the circuit 134a may comprise a transistor N7 and a transistor P12. The transistors N7 and P12 may each have a source that may receive the read reference level VR and a drain that may be connected to the node C. The transistor N7 may have a gate that may receive the signal SAPRE and a P-well that may receive the ground potential VGND. The transistor P12 may have a gate that may receive the signal SAPRB and an N-well that may receive the supply voltage VPWR. The transistor N7 may be implemented as one or more NMOS transistor. The transistor P12 may be implemented as one or more PMOS transistors. However, other types and/or polarities of transistors may be implemented accordingly to meet the design criteria of a particular application.

The circuit 134b may have an input that may receive the signal SAPRE, an input that may receive the signal SAPRB and an output 198 that may be connected to the node Cb. In one example, the circuit 134b may be a precharge circuit that may be configured to precharge the node Cb to the read reference level VR in response to the signals SAPRE and SAPRB before a memory read operation using the circuit 100 is performed.

In one example, the circuit 134b may comprise a transistor N8 and a transistor P13. The transistors N8 and P13 may each have a source that may receive the read reference level VR and a drain that may be connected to the node Cb. The transistor N8 may have a gate that may receive the signal SAPRE and a P-well that may receive the ground potential VGND. The transistor P13 may have a gate that may receive the signal SAPRB and an N-well that may receive the supply voltage VPWR. The transistor N8 may be implemented as one or more NMOS transistor. The transistor P13 may be implemented as one or more PMOS transistors. However, other types and/or polarities of transistors may be implemented accordingly to meet the design criteria of a particular application.

In an alternative embodiment, the circuit 100 may be implemented without the circuits 128 and 130. When the circuit 100 is implemented without the initial amplifier circuit 128 and the bias circuit 130, a read operation of the memory cell 10 may be initiated by raising only the signal VBIAS. However, implementation of the circuit 100 without the circuits 128 and 130 may be vulnerable to sensing error. The sensing error may be caused by (i) incomplete equilibration of the nodes C and Cb or (ii) naturally occurring imbalances in implementing the circuit 100.

Figure 4:
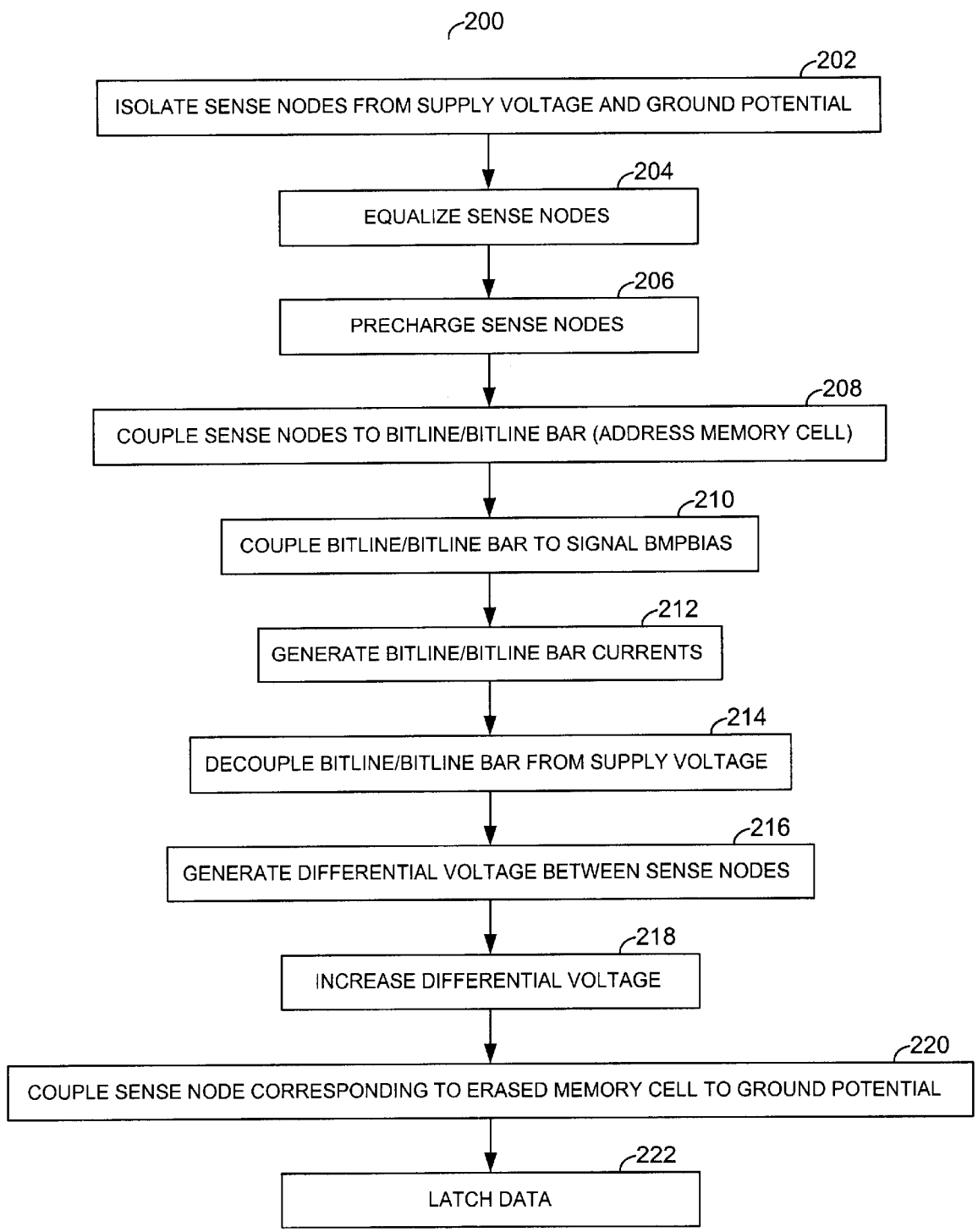
FIG. 4 is a flow diagram illustrating an example operation in accordance with a preferred embodiment of the present invention.

Referring to FIG. 4, a flow diagram 200 illustrating an example read operation of the present invention is shown. The read operation may comprise the following steps. First, the nodes C and Cb may be isolated from the supply voltage VPWR and the ground potential VGND (e.g., block 202). Next, the nodes C and Cb may be equalized (e.g., block 204). The nodes C and Cb may be precharged to the read reference voltage VR (e.g., block 206). The nodes C and Cb may be coupled to the bitline BL and the bitline bar BLb, respectively (e.g., the memory cell 10 may be addressed, block 208). The nodes C and Cb may be coupled to the signal BMPBIAS. Thereby, the signal BMPBIAS may also be coupled to the bitline BL and the bitline bar BLb (e.g., block 210). However, the bitline BL and the bitline bar BLb are generally not directly coupled to the ground potential VGND.

The currents IBIT and IBITB may be generated in response to data stored on the memory cell 10 and the pulse (bump) in the bitline BL/bitline bar BLb voltages caused by the circuit 128 in response to the signal SAP2 (e.g., block 212). The bitline BL and the bitline bar BLb may then be decoupled from the supply voltage VPWR (e.g., block 214). A differential voltage may be generated between the nodes C and Cb in response to the currents IBIT and IBITB (e.g., block 216). However, in an alternative embodiment (e.g., when the circuit 100 is implemented without the circuits 128 and 130), the read operation will generally not include the block 210. The differential voltage between the nodes C and Cb may be increased by (i) the circuit 120 in response to the signal SAP and (ii) the circuit 132 in response to the signals SAN1 and SAN2 (e.g., block 218). When the circuit 132 detects the current IBIT or the current IBITB has risen above a predetermined magnitude, the node C or Cb corresponding to the location of an erased memory cell transistor may be coupled to the ground potential VGND (e.g., block 220). The state of the data stored on the memory cell 10 as sensed by the sense amplifier circuit 100 may be latched by circuitry external to the circuit 100 (e.g., block 222).

Figure 5:
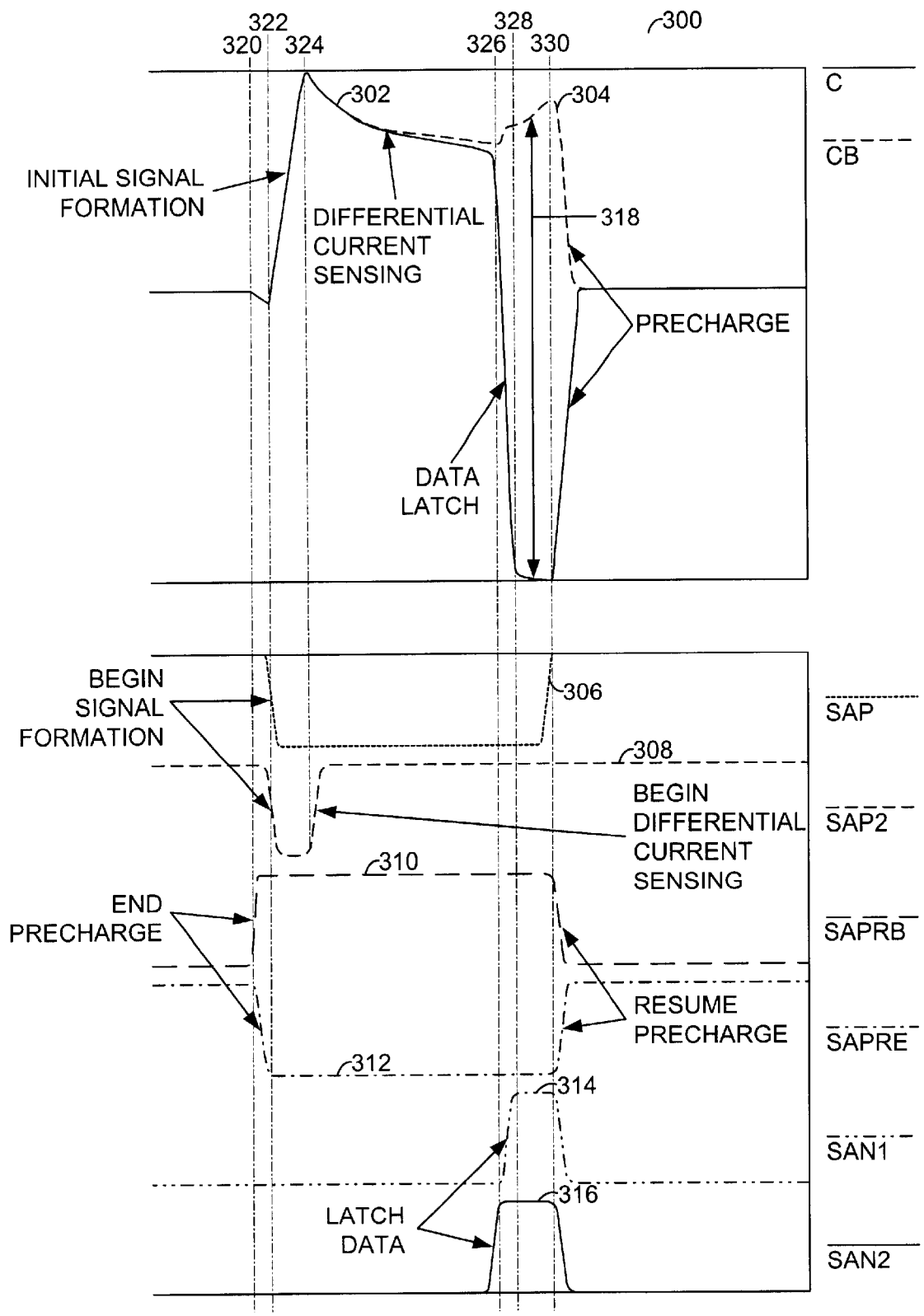
FIG. 5 is a timing diagram illustrating an example operation of the present invention.

Referring to FIG. 5, a timing diagram 300 illustrating example waveforms of a read operation of the circuit 100 is shown. The simulation conditions generally presume typical transistor models and 25° C. junction temperature. A waveform 302 illustrates a voltage level that may be measured at the node C. A waveform 304 illustrates a waveform of a voltage level that may be measured at the node Cb. A waveform 306 may be a waveform of the signal SAP. A waveform 308 may be a waveform of the signal SAP2. A waveform 310 may be a waveform of the signal SAPRB. A waveform 312 may be a waveform of the signal SAPRE. A waveform 314 may be a waveform of the signal SAN1. A waveform 316 may be a waveform of the signal SAN2. The waveforms 302 and 304 may have a differential voltage 318 that may be controlled to swing rail-to-rail during a read cycle.

The circuit 100 may be in a precharge state (e.g., the bitline BL, the bitline bar BLb, the node C, and the node Cb may be at the read reference voltage VR—the memory cell 10 may be non-conductive). The read operation may be initiated at a time 320 by de-asserting the signal SAPRB (e.g., a digital HIGH state or "1") and de-asserting the signal SAPRE (e.g., a digital LOW state or "0"). The read operation may be initiated by ending the precharge state as controlled by the signals SAPRE and SAPRB. At a time 322 the signals SAP and SAP2 may be pulled LOW. Pulling the signals SAP and SAP2 LOW may begin the formation of the signal currents IBIT and IBITB. The voltage at the nodes C and Cb may be raised in response to the currents IBIT and IBITB (e.g., the circuit 128 may pulse and/or bump the voltage at the nodes C and Cb). The rise in voltage at the nodes C and Cb may cause the currents IBIT and IBITB to flow from the circuit 100 through the bitline BL and the bitline bar BLb, to the memory cell 10.

When the signal SAP2 returns to a HIGH logic state (e.g., at a time 324), the differential signal currents IBIT and IBITB may be forced to flow through the transistors P1 and P2 (e.g., the circuit 100 may steer the currents IBIT and IBITB). However, in an alternative implementation, the circuit 100 may be logically inverted such that the N-channel transistors N2 and N3 of the circuit 132 provide the current steering (e.g., the circuit 132 may steer the currents IBIT and IBITB). The differential current flow through the circuit 100 may cause the differential voltage 318 to form between the nodes C and Cb. The differential voltage 318 may continue to increase until the signal SAN2 is asserted (e.g., a logic HIGH) at a time 326. The assertion of the signal SAN2 may cause the differential voltage 318 to further increase (e.g., the circuit 132 may further amplify and/or steer the currents IBIT and IBITB). At a time 328, the signal SAN1 may be asserted (e.g., a digital HIGH), further accelerating the signal swing on node C to the ground potential VGND (e.g., the circuit 132 may further amplify the voltage at the nodes C and Cb). At a time 330, the data stored on the memory cell 10 as presented by the circuit 100 may be latched externally. The circuit 100 may be returned to the precharge state (e.g., the signals SAN1, and SAN2 may be de-asserted to (LOW), the signal SAPRE may be asserted (HIGH), and the signal SAPRB may be asserted (LOW)).

While the circuit 100 has been shown implemented as a single stage, alternatively the circuit 100 may be implemented using more than one stage of the circuit 120. Similarly, the circuit 100 may be implemented including more than one stage of the circuit 128. One or more stages of the circuit 128 may also be implemented in memory read circuits with one or more sense amplifier stages constructed using conventional technology.

In another example, the circuit 100 may be implemented with floating gate non-volatile memory cell memory arrays (e.g., FLASH, EEPROM, etc.). The circuit 100 may also be implemented with a single transistor non-volatile memory cell memory array by implementing an appropriate current reference connected to one side of the circuit 120 (e.g., connected to the transistor P1 or the transistor P2).

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. A method for reading a memory cell comprising the steps of:

(A) raising a voltage level of a bitline of said memory cell above a predetermined level;
    (B) detecting a current flow generated on said bitline in response to said raised voltage level; and
    (C) coupling one or more sense nodes coupled to said bitline to a ground potential when said current flow is above a predetermined magnitude.

2. The method according to claim 1, wherein step A further comprises the sub-steps of:

(A-1) isolating said one or more sense nodes from a supply voltage and said ground potential; and
    (A-2) equalizing said sense nodes.

3. The method according to claim 2, wherein step B further comprises the sub-step of:

(B-1) generating a voltage differential between two of said sense nodes.

4. The method according to claim 3, wherein step B further comprises the sub-step of:

(B-2) increasing said current flow in response to one or more bias control signals.

5. The method according to claim 3, wherein step B further comprises the sub-step of:

(B-2) increasing said differential voltage in response to one or more initial amplifier control signals.

6. The method according to claim 1, wherein said coupling of said one or more said sense nodes to said bitline comprises addressing said memory cell.

7. The method according to claim 3, further comprising the step of:

increasing said differential voltage in response to one or more post-sense control signals.

8. The method according to claim 4, further comprising the step of:

biasing a sense amplifier to any of a number of levels in response to said one or more bias control signals, wherein said sense amplifier comprises said one or more sense nodes.

9. An apparatus for reading a memory cell comprising:

a circuit configured to (i) raise a voltage level of a bitline of said memory cell above a predetermined level and (ii) generate a current flow in said bitline in response to said raised voltage, and (iii) couple one or more sense nodes coupled to said bitline to a ground potential in response to detection of said current flow above a predetermined magnitude.

10. The apparatus according to claim 9, wherein said bitline comprises one or more bitlines each having a current flow and during said read of said memory cell (i) said current flows are generated in response to data stored on said memory cell and (ii) a differential voltage is generated between two of said bitlines.

11. The apparatus according to claim 10, wherein said apparatus further comprises (i) one or more sense amplifiers having said one or more sense nodes and (ii) one or more initial amplifier circuits configured to amplify said differential voltage.

12. The apparatus according to claim 11, wherein said apparatus further comprises one or more post-sense amplifier circuits configured to amplify said differential voltage.

13. The apparatus according to claim 12, wherein said apparatus further comprises an equalizer circuit configured to equalize said sense nodes prior to said read operation.

14. The apparatus according to claim 12, wherein said apparatus further comprises one or more first bias circuits configured to bias said one or more initial amplifier circuits.

15. The apparatus according to claim 14, wherein said apparatus further comprises one or more second bias circuits configured to bias said one or more sense amplifier circuits to one or more levels in response to one or more second bias control signals.

16. The apparatus according to claim 15, wherein said one or more second bias circuits are further configured to control said current flows.

17. The apparatus according to claim 15, wherein said one or more second bias circuits are further configured to control said differential voltage.

18. The apparatus according to claim 12, wherein said one or more post-sense amplifier circuits are further configured to amplify said current flows.

19. The apparatus according to claim 11, wherein said one or more sense amplifiers comprise cross-coupled amplifiers.

20. An apparatus for reading a memory cell comprising:

means for raising a voltage level of a bitline of said memory cell above a predetermined level;

means for detecting a current flow generated on said bitline in response to said raised voltage level; and means for coupling one or more sense nodes coupled to said bitline to a ground potential when said current flow is above a predetermined magnitude.

* * * * *

UNITED STATES PATENT AND TRADEMARK OFFICE
CERTIFICATE OF CORRECTION

PATENT NO. : 6,501,696 B1
DATED : December 31, 2002
INVENTOR(S) : Thomas M. Mnich and John Eric Gross It is certified that error appears in the above-identified patent and that said Letters Patent is hereby corrected as shown below:

<u>Title page,</u>
Item [73], Assignee, "Cypress Seminconductor Corp." should be
-- Cypress Semiconductor Corp. --

Signed and Sealed this

Third Day of June, 2003

JAMES E. ROGAN
*Director of the United States Patent and Trademark Office*